US008847638B2

(12) United States Patent
Chan et al.

(10) Patent No.: US 8,847,638 B2
(45) Date of Patent: Sep. 30, 2014

(54) HIGH SPEED DIVIDE-BY-TWO CIRCUIT

(75) Inventors: Ngar Loong Alan Chan, Santa Clara, CA (US); Shen Wang, Santa Clara, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/496,875

(22) Filed: Jul. 2, 2009

(65) Prior Publication Data
US 2011/0001522 A1 Jan. 6, 2011

(51) Int. Cl.
*H03B 19/06* (2006.01)
*H03K 3/356* (2006.01)

(52) U.S. Cl.
CPC .................................. *H03K 3/35613* (2013.01)
USPC ............ 327/118; 327/115; 327/117; 327/122

(58) Field of Classification Search
USPC ......... 327/115, 116, 117, 118, 355–360, 202, 327/203, 208–212, 218; 377/47, 48
See application file for complete search history.

(56) References Cited

U.S. PATENT DOCUMENTS

| 4,061,882 | A | 12/1977 | Dorren |
| 4,333,020 | A | 6/1982 | Maeder |
| 4,555,777 | A | 11/1985 | Poteet |
| 4,623,801 | A | 11/1986 | Rocchi |
| 4,716,320 | A | 12/1987 | McAdams |
| 4,959,557 | A | 9/1990 | Miller |
| 5,097,157 | A | 3/1992 | Jaffe et al. |
| 5,103,114 | A | 4/1992 | Fitch |
| 5,103,116 | A | 4/1992 | Sivilotti et al. |
| 5,103,144 | A | 4/1992 | Dunham |
| 5,192,875 | A | 3/1993 | Kielmeyer, Jr. |
| 5,375,258 | A | 12/1994 | Gillig |
| 5,477,180 | A | 12/1995 | Chen |
| 5,534,803 | A | 7/1996 | Correale, Jr. et al. |

(Continued)

FOREIGN PATENT DOCUMENTS

| CN | 1412947 A | 4/2003 |
| CN | 1904773 A | 1/2007 |

(Continued)

OTHER PUBLICATIONS

Chan, "Hercules (RTR9800) Divider", Aug. 2005.

(Continued)

*Primary Examiner* — Brandon S Cole
(74) *Attorney, Agent, or Firm* — Kevin T. Cheatham

(57) ABSTRACT

A high frequency divider involves a plurality of differential latches. Each latch includes a pair of cross-coupled P-channel transistors and a variable resistance element. The latch is controlled to have a lower output resistance at high operating frequencies by setting a multi-bit digital control value supplied to the variable resistance element. Controlling the latch to have a reduced output resistance at high frequencies allows the 3 dB bandwidth of the latch to be maintained over a wide operating frequency range. The variable resistance element is disposed between the two differential output nodes of the latch such that appreciable DC bias current does not flow across the variable resistance element. As a consequence, good output signal voltage swing is maintained at high frequencies, and divider current consumption does not increase appreciably at high frequencies as compared to output signal swing degradation and current consumption increases in a conventional differential latch divider.

41 Claims, 8 Drawing Sheets

DIVIDE-BY-TWO AND QUADRATURE SIGNAL GENERATING CIRCUIT

(56) References Cited

U.S. PATENT DOCUMENTS

| | | | |
|---|---|---|---|
| 5,682,109 A | 10/1997 | Ohmi et al. | |
| 5,708,399 A | 1/1998 | Fujii et al. | |
| 5,983,082 A | 11/1999 | Hilbert | |
| 5,994,935 A | 11/1999 | Ueda et al. | |
| 6,014,047 A | 1/2000 | Dreps et al. | |
| 6,037,816 A | 3/2000 | Yamauchi | |
| 6,057,823 A | 5/2000 | Aoki et al. | |
| 6,166,571 A | 12/2000 | Wang | |
| 6,169,434 B1 | 1/2001 | Portmann | |
| 6,188,291 B1 * | 2/2001 | Gopinathan et al. | 331/45 |
| 6,191,629 B1 | 2/2001 | Bisanti et al. | |
| 6,239,640 B1 | 5/2001 | Liao et al. | |
| 6,310,501 B1 | 10/2001 | Yamashita | |
| 6,316,987 B1 | 11/2001 | Dally et al. | |
| 6,320,418 B1 | 11/2001 | Fujii et al. | |
| 6,320,438 B1 | 11/2001 | Arcus | |
| 6,420,921 B1 | 7/2002 | Okayasu et al. | |
| 6,426,660 B1 | 7/2002 | Ho et al. | |
| 6,433,589 B1 | 8/2002 | Lee | |
| 6,542,015 B2 | 4/2003 | Zhou et al. | |
| 6,593,789 B2 | 7/2003 | Atallah et al. | |
| 6,661,269 B2 | 12/2003 | Simon et al. | |
| 6,667,703 B1 | 12/2003 | Reuveni et al. | |
| 6,674,772 B1 | 1/2004 | Dally et al. | |
| 6,831,497 B2 | 12/2004 | Koh et al. | |
| 6,836,240 B1 | 12/2004 | Dubbert et al. | |
| 6,897,696 B2 | 5/2005 | Chang | |
| 6,904,538 B2 | 6/2005 | Glas et al. | |
| 6,933,759 B1 | 8/2005 | Wu et al. | |
| 6,967,514 B2 | 11/2005 | Kizer et al. | |
| 6,995,589 B2 | 2/2006 | Chen et al. | |
| 7,027,793 B2 | 4/2006 | Gard et al. | |
| 7,075,377 B2 * | 7/2006 | Metaxakis | 331/46 |
| 7,099,643 B2 | 8/2006 | Lin | |
| 7,110,469 B2 | 9/2006 | Shi et al. | |
| 7,184,512 B2 | 2/2007 | Takeshita et al. | |
| 7,239,209 B2 | 7/2007 | Adan | |
| 7,271,622 B2 * | 9/2007 | Metaxakis | 327/12 |
| 7,298,222 B2 | 11/2007 | Rosik et al. | |
| 7,307,461 B2 | 12/2007 | Nguyen et al. | |
| 7,315,220 B1 | 1/2008 | Robinson et al. | |
| 7,323,944 B2 | 1/2008 | Florescu et al. | |
| 7,336,114 B2 | 2/2008 | Razavi et al. | |
| 7,352,229 B1 | 4/2008 | Mei et al. | |
| 7,388,416 B2 | 6/2008 | Marutani | |
| 7,423,468 B2 | 9/2008 | Cho | |
| 7,457,605 B2 | 11/2008 | Thompson et al. | |
| 7,474,715 B1 | 1/2009 | Ni et al. | |
| 7,521,976 B1 | 4/2009 | Sudjian et al. | |
| 7,545,230 B2 | 6/2009 | Jang et al. | |
| 7,554,380 B2 | 6/2009 | Embabi et al. | |
| 7,580,483 B2 | 8/2009 | Ibrahim et al. | |
| 7,603,094 B2 | 10/2009 | Rahman et al. | |
| 7,616,938 B2 | 11/2009 | Behzad et al. | |
| 7,619,456 B2 | 11/2009 | Kim et al. | |
| 7,656,205 B2 | 2/2010 | Chen et al. | |
| 7,683,682 B1 | 3/2010 | Won et al. | |
| 7,693,230 B2 | 4/2010 | Sorrells et al. | |
| 7,715,836 B2 | 5/2010 | Vassiliou et al. | |
| 7,750,708 B2 | 7/2010 | Gschier | |
| 7,750,749 B2 | 7/2010 | Jones | |
| 7,768,330 B2 | 8/2010 | Yuuki et al. | |
| 7,808,329 B2 | 10/2010 | Azadet et al. | |
| 7,821,315 B2 | 10/2010 | Bossu et al. | |
| 7,932,844 B1 | 4/2011 | Huynh et al. | |
| 7,965,111 B2 | 6/2011 | Sun et al. | |
| 8,095,103 B2 | 1/2012 | Asuri | |
| 8,164,361 B2 | 4/2012 | Soltanian et al. | |
| 8,248,132 B2 | 8/2012 | Chang | |
| 2001/0050583 A1 | 12/2001 | Fulkerson | |
| 2002/0000834 A1 | 1/2002 | Ooishi | |
| 2002/0079938 A1 | 6/2002 | Saeki | |
| 2002/0113270 A1 | 8/2002 | Bernstein et al. | |
| 2002/0160740 A1 | 10/2002 | Hatcher et al. | |
| 2003/0042957 A1 | 3/2003 | Tamura | |
| 2003/0042989 A1 * | 3/2003 | Sakurai | 331/175 |
| 2003/0102926 A1 | 6/2003 | Hsieh | |
| 2004/0008092 A1 | 1/2004 | Hajimiri et al. | |
| 2004/0036541 A1 | 2/2004 | Fang et al. | |
| 2004/0051397 A1 | 3/2004 | Juntunen et al. | |
| 2004/0147238 A1 | 7/2004 | Wang et al. | |
| 2004/0212741 A1 * | 10/2004 | Hijikata et al. | 348/707 |
| 2005/0024097 A1 | 2/2005 | Sim et al. | |
| 2005/0046494 A1 * | 3/2005 | Lee et al. | 331/46 |
| 2005/0122149 A1 | 6/2005 | Cho et al. | |
| 2005/0174157 A1 | 8/2005 | Calo et al. | |
| 2006/0035617 A1 | 2/2006 | Kim | |
| 2006/0059376 A1 | 3/2006 | Ngo et al. | |
| 2006/0067424 A1 | 3/2006 | Wolf | |
| 2006/0119446 A1 * | 6/2006 | Li | 331/74 |
| 2007/0037544 A1 | 2/2007 | Heikkinen | |
| 2007/0076832 A1 | 4/2007 | Matsudera | |
| 2007/0239319 A1 | 10/2007 | Inukai et al. | |
| 2007/0242548 A1 | 10/2007 | Tonti et al. | |
| 2007/0257742 A1 * | 11/2007 | Cha et al. | 331/167 |
| 2007/0273485 A1 | 11/2007 | Balachandran et al. | |
| 2007/0285120 A1 | 12/2007 | Venditti et al. | |
| 2008/0001645 A1 | 1/2008 | Kuroki | |
| 2008/0032646 A1 | 2/2008 | Huang et al. | |
| 2008/0048736 A1 | 2/2008 | Ruy | |
| 2008/0061894 A1 | 3/2008 | Raita et al. | |
| 2008/0074148 A1 | 3/2008 | Srivastava et al. | |
| 2008/0096508 A1 | 4/2008 | Luff | |
| 2008/0106313 A1 | 5/2008 | Keady et al. | |
| 2008/0116902 A1 | 5/2008 | Kim et al. | |
| 2008/0132195 A1 | 6/2008 | Maxim et al. | |
| 2008/0180139 A1 | 7/2008 | Natonio et al. | |
| 2008/0225169 A1 | 9/2008 | Takita et al. | |
| 2008/0231379 A1 | 9/2008 | Jang et al. | |
| 2008/0258781 A1 * | 10/2008 | Song et al. | 327/117 |
| 2009/0033430 A1 * | 2/2009 | Jang et al. | 331/57 |
| 2009/0066157 A1 | 3/2009 | Tarng et al. | |
| 2009/0102520 A1 | 4/2009 | Lee et al. | |
| 2009/0108885 A1 | 4/2009 | Natonio et al. | |
| 2009/0131006 A1 | 5/2009 | Wu | |
| 2009/0154595 A1 | 6/2009 | Choksi et al. | |
| 2009/0156135 A1 | 6/2009 | Kamizuma et al. | |
| 2009/0184741 A1 | 7/2009 | Suda et al. | |
| 2009/0256596 A1 | 10/2009 | Oh | |
| 2009/0284288 A1 * | 11/2009 | Zhang et al. | 327/118 |
| 2009/0284311 A1 * | 11/2009 | Ito | 327/581 |
| 2009/0310711 A1 | 12/2009 | Chiu et al. | |
| 2010/0012648 A1 | 1/2010 | Gustafsson et al. | |
| 2010/0120390 A1 | 5/2010 | Panikkath et al. | |
| 2010/0130139 A1 | 5/2010 | Panikkath et al. | |
| 2010/0194485 A1 | 8/2010 | Chawla et al. | |
| 2010/0198540 A1 | 8/2010 | Yanagisawa et al. | |
| 2010/0226459 A1 | 9/2010 | Park et al. | |
| 2011/0012648 A1 | 1/2011 | Qiao et al. | |
| 2011/0043291 A1 | 2/2011 | Fagg | |
| 2011/0050296 A1 | 3/2011 | Fagg | |
| 2011/0181330 A1 | 7/2011 | Oh | |
| 2013/0012150 A1 | 1/2013 | Panikkath et al. | |
| 2013/0271188 A1 | 10/2013 | Chan | |
| 2013/0328707 A1 | 12/2013 | Choksi et al. | |
| 2013/0336143 A1 | 12/2013 | Choksi et al. | |

FOREIGN PATENT DOCUMENTS

| | | |
|---|---|---|
| EP | 0398751 A2 | 11/1990 |
| EP | 0637134 A1 | 2/1995 |
| EP | 0872956 A2 | 10/1998 |
| EP | 1345317 A2 | 9/2003 |
| EP | 1394944 | 3/2004 |
| EP | 1416691 A1 | 5/2004 |
| EP | 1655591 A1 | 5/2006 |
| EP | 1679796 A1 | 7/2006 |
| EP | 2294691 A2 | 3/2011 |
| FR | 2670975 A1 | 6/1992 |
| GB | 2321144 A | 7/1998 |
| JP | 53048401 A | 5/1978 |
| JP | 59008112 A | 1/1984 |
| JP | 62141219 U | 9/1987 |
| JP | 63078610 A | 4/1988 |

(56) References Cited

FOREIGN PATENT DOCUMENTS

| | | |
|---|---|---|
| JP | H0194723 A | 4/1989 |
| JP | H01314013 A | 12/1989 |
| JP | 2058951 A | 2/1990 |
| JP | 2060330 U | 5/1990 |
| JP | 2131615 A | 5/1990 |
| JP | H03262317 A | 11/1991 |
| JP | H04152711 A | 5/1992 |
| JP | H05235746 A | 9/1993 |
| JP | 5268000 A | 10/1993 |
| JP | 7170162 A | 7/1995 |
| JP | 9046195 A | 2/1997 |
| JP | 9191238 A | 7/1997 |
| JP | H09284125 A | 10/1997 |
| JP | 10111674 A | 4/1998 |
| JP | 10247842 A | 9/1998 |
| JP | H11298077 A | 10/1999 |
| JP | 2000295090 A | 10/2000 |
| JP | 2000332583 A | 11/2000 |
| JP | 2001245007 A | 9/2001 |
| JP | 2001312328 A | 11/2001 |
| JP | 2001313228 A | 11/2001 |
| JP | 2002043900 A | 2/2002 |
| JP | 2002064367 A | 2/2002 |
| JP | 2003101397 A | 4/2003 |
| JP | 2003512752 A | 4/2003 |
| JP | 2003224471 A | 8/2003 |
| JP | 2004129255 A | 4/2004 |
| JP | 2004531126 A | 10/2004 |
| JP | 2004336822 A | 11/2004 |
| JP | 2005110080 A | 4/2005 |
| JP | 2006093748 A | 4/2006 |
| JP | 2006115148 A | 4/2006 |
| JP | 2006173897 A | 6/2006 |
| JP | 2006217563 A | 8/2006 |
| JP | 2006287819 A | 10/2006 |
| JP | 2006314029 A | 11/2006 |
| JP | 2007102483 A | 4/2007 |
| JP | 2008029008 A | 2/2008 |
| JP | 2008054134 A | 3/2008 |
| JP | 2008124836 A | 5/2008 |
| JP | 2010003925 A | 1/2010 |
| JP | 2010539819 A | 12/2010 |
| JP | 5235746 B2 | 7/2013 |
| KR | 20050055925 A | 6/2005 |
| KR | 100791934 B1 | 1/2008 |
| TW | 200305312 A | 10/2003 |
| TW | 200529566 | 9/2005 |
| TW | 200723676 | 6/2007 |
| TW | I283515 B | 7/2007 |
| WO | WO9621270 A1 | 7/1996 |
| WO | WO9912259 A2 | 3/1999 |
| WO | WO0129965 A1 | 4/2001 |
| WO | WO0251091 A1 | 6/2002 |
| WO | 02052691 A1 | 7/2002 |
| WO | WO-2004047324 A1 | 6/2004 |
| WO | WO2006033203 A1 | 3/2006 |
| WO | WO2009036397 | 3/2009 |
| WO | WO2009036399 | 3/2009 |
| WO | WO2010068504 | 6/2010 |

OTHER PUBLICATIONS

Chan et al., "Hercules (RTR9800) Divider", Aug. 2005.

International Search Report and Written Opinion—PCT/US2010/040979, International Search Authority—European Patent Office—Sep. 20, 2010.

Co-pending U.S. Appl. No. 13/011,716, filed Jan. 21, 2011.

Navid S et al., "Level-Locked Loop: A Technique for Broadband Quadrature Signal Generation", Custom Integrated Circuits Conference, 1997., Proceedings of the IEEE 1997 Santa Clara, CA, USA May 5-8, 1997, New York, NY, USA, IEEE, US, May 5, 1997, pp. 411-414, XP010235334, DOI: 10.1109/CICC.1997.606656 ISBN: 978-0-7803-3669-8.

Roufoogaran R, et al., "A compact and power efficient local oscillator generation and distribution system for complex multi radio systems" Radio Frequency Integrated Circuits Symposium, 2008. RFIC 2008. IEEE, IEEE, Piscataway, NJ, USA, Jun. 17, 2008, pp. 277-280, XP031284334 ISBN: 978-1-4244-1808-4 Section 111. Detailed Description; pp. 277-279.

Fuse, T et al: "A 1.1V SOI CMOS Frequency Divider Using Body-Inputting SCL Circuit Technology", 2000 IEEE International SOI Conference Proceedings. Wakefield, MA, Oct. 2-5, 2000; [IEEE International SOI Conference], New York, NY : IEEE, US, Oct. 2, 2000, p. 106/107, XP001003452, ISBN: 978-0-7803-6390-8 p. 106; figure 3.

Lee, T.H., et al., "A 2.5 V CMOS delay-locked loop for 18 Mbit, 500 megabyte/s DRAM," Solid-State Circuits, IEEE Journal of , vol. 29, No. 12, pp. 1491-1496, Dec. 1994.

* cited by examiner

DIVIDE-BY-TWO AND QUADRATURE SIGNAL
GENERATING CIRCUIT

|  | PRIOR ART OF FIG. 1 | PRIOR ART OF FIG. 2 | EMBODIMENT OF FIG. 6 |
|---|---|---|---|
| OUTPUT SWING (V) | ND | 0.63 | 0.92 |
| CURRENT (RMS) (mA) | ND | 6.3 | 2.4 |
| PHASE NOISE @ 10kHz | ND | -129 | -133 |
| PHASE NOISE @ 10MHz | ND | -166 | -162 |
| OUTPUT SWING (V) | ND | 0.56 | 1.14 |
| CURRENT (RMS) (mA) | ND | 8.9 | 4.2 |
| PHASE NOISE @ 10kHz | ND | -133 | -139 |
| PHASE NOISE @ 10MHz | ND | -160 | -162 |
| OUTPUT SWING (V) | ND | 0.48 | 0.73 |
| CURRENT (RMS) (mA) | ND | 15.9 | 4.0 |
| PHASE NOISE @ 10kHz | ND | N/A | N/A |
| PHASE NOISE @ 10MHz | ND | N/A | N/A |
| MAX INPUT FREQ. (GHz) | 0.8 | 15 | 14 |
| FREQ. OP. RANGE (GHz) | ~0.8 | 2-15 | 2-14 |

ND = INDICATES THE CIRCUIT IS NOT DIVIDING AT THESE FREQUENCIES.

INPUT SWING = 0.9V @ 4.6GHz, VCC=1.3V
INPUT SWING = 0.9V @ 7.8GHz, VCC=1.3V
INPUT SWING = 0.9V @ 14GHz, VCC=1.3V

AS FREQUENCY INCREASES THE OUTPUT SIGNAL VOLTAGE SWING DOES NOT DEGRADE TO LESS THAN 50% OF ITS LOW FREQUENCY VALUE

AS FREQUENCY INCREASES THE CURRENT CONSUMPTION DOES NOT INCREASE TO MORE THAN 200% OF ITS MINIMUM VALUE IN THE FREQUENCY OPERATING RANGE

PERFORMANCE COMPARISON CHART

FIG. 8

PHASE NOISE COMPARISON

HIGH SPEED DIVIDE-BY-TWO CIRCUIT

BACKGROUND INFORMATION

1. Technical Field

The disclosed embodiments relate to high frequency dividers involving differential latches.

2. Background Information

High frequency dividers see use in many applications including uses in radio communications circuitry. In one example, a high frequency divider involving differential latches receives an input signal and frequency divides the input signal, thereby generating two lower frequency output signals: an in-phase (I) output signal, and a quadrature (Q) output signal. The frequencies of the I and Q output signals may, for example, be half the frequency of the input signal. The divider divides by the integer two. The Q output signal is of the same frequency as the I output signal, but has a ninety degree phase shift with respect to the I output signal. Such a divider may, for example, be used to supply I and Q signals to a mixer in a radio receiver. By changing the frequency of the I and Q signals as supplied to the mixer, the receiver can be tuned to downconvert signals of different frequencies. This is but one application of a high frequency divider of this type. A high frequency divider may also see use in the loop divider of a Phase-Locked Loop (PLL) within a local oscillator, or in frequency dividing a signal in other places in the radio circuitry.

FIG. 1 (Prior Art) is a diagram of one type of conventional divider. This divider 1 includes two differential latches 2 and 3. Divider 1 receives a differential input signal VO involving signal VOP on conductor 4 and signal VON on conductor 5. The "VO" letters in these signal names indicates that the signal is a VCO output signal. Divider 1 receives the differential input signal VO and generates therefrom two differential output signals I and Q. Differential output signal I involves signal IP on conductor 6 and signal IN on conductor 7. Differential output signal Q involves signal QP on conductor 8 and signal QN on conductor 9. Although the circuit of FIG. 1 operates satisfactorily in some applications, it has limitations including an undesirably low frequency operating range. For additional information on a divider of the type of divider 1, see U.S. Pat. No. 7,521,976.

FIG. 2 (Prior Art) is a diagram of another type of conventional divider. Divider 10 includes two differential latches 11 and 12. Divider 10 receives a differential input signal VO involving signal VOP on conductor 13 and signal VON on conductor 14. Divider 10 generates two differential output signals I and Q. Differential output signal I involves signal IP on conductor 15 and signal IN on conductor 16. Differential output signal Q involves signal QP on conductor 17 and signal QN on conductor 18. Dividers of the circuit topology of divider 10 can be implemented and controlled to have a relatively wide frequency operating range, but at higher frequencies the voltage swing of the output signals may decrease in an undesirable manner and the circuit may consume an increased amount of current. In applications such as in a receiver of a battery-powered cellular telephone, it may be desired to operate a divider that generates low phase noise I and Q signals of a high frequency such as a few gigahertz or more, without consuming large amounts of power and without suffering drawbacks associated with low voltage swings of the output signals.

SUMMARY

A high frequency divider involves a plurality of differential latches. In one application, the high frequency divider receives a differential input signal, and frequency divides the signal by two, and outputs two differential output signals. A first of the differential output signals is an in-phase (I) differential output signal. A second of the differential output signals is a quadrature (Q) differential output signal. Each differential latch of the divider includes a pair of cross-coupled P-channel transistors and a digitally-controllable variable resistance element. The differential latch is controlled to have a lower output resistance at high divider operating frequencies by setting a multi-bit digital control value supplied to the digitally-controllable variable resistance element. Controlling the differential latch to have such a reduced output resistance at high divider operating frequencies allows the 3 dB bandwidth (natural frequency) of differential latch to be maintained over a wide operating frequency range. The digitally-controllable variable resistance element is disposed between the two differential output nodes of the differential latch such that no appreciable DC bias current flows through the variable resistance element. As a consequence, reducing the output resistance does not degrade appreciably. The output voltage swing of the divider does not degrade appreciably at high operating frequencies as compared to the output signal voltage swing of a conventional high frequency divider circuit. Because output resistance can be decreased at high operating frequencies without serious degradation of output signal voltage swing, the DC bias current flowing through the latch does not have to be increased to maintain an acceptable output signal voltage swing and to maintain the divider operating at high operating frequencies. Current consumption of the divider therefore does not increase appreciably at high operating frequencies as compared to current consumption of a conventional high frequency divider circuit.

In one specific example, the high frequency divider is operable to frequency divide an input signal over a wide frequency range from 4.6 gigahertz to 14 gigahertz, where the output signal voltage swing of the divider decreases from approximately 1.14 volts to approximately 0.73 volts as a rough function of operating frequency over the 4.6 to 14 gigahertz operating range, assuming a VCC supply voltage of 1.3 volts. Accordingly, over the 4.6 gigahertz to 14 gigahertz operating frequency range, the output signal voltage swing does not decrease to less than approximately fifty percent of the supply voltage. If, for example, the supply voltage is 1.3 volts, then the output signal voltage swing does not decrease to less than approximately 0.65 volts over the entire frequency operating range. In addition, the specific example of the high frequency divider is operable to frequency divide the input signal over the wide frequency range from 4.6 gigahertz to 14 gigahertz, where current consumption of the divider increases from approximately 2.4 milliamperes to approximately 4.2 milliamperes as a rough function of operating frequency over the 4.6 to 14 gigahertz operating range. Accordingly, over the 4.6 gigahertz to 14 gigahertz operating range, divider current consumption does not increase to more than two hundred percent of its minimum value in this operating frequency range.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

BRIEF DESCRIPTION OF THE DRAWINGS

FIG. 8 is a chart that compares operation of the divider of FIG. 6 to the conventional dividers of FIG. 1 and FIG. 2.

DETAILED DESCRIPTION

Figure 3:
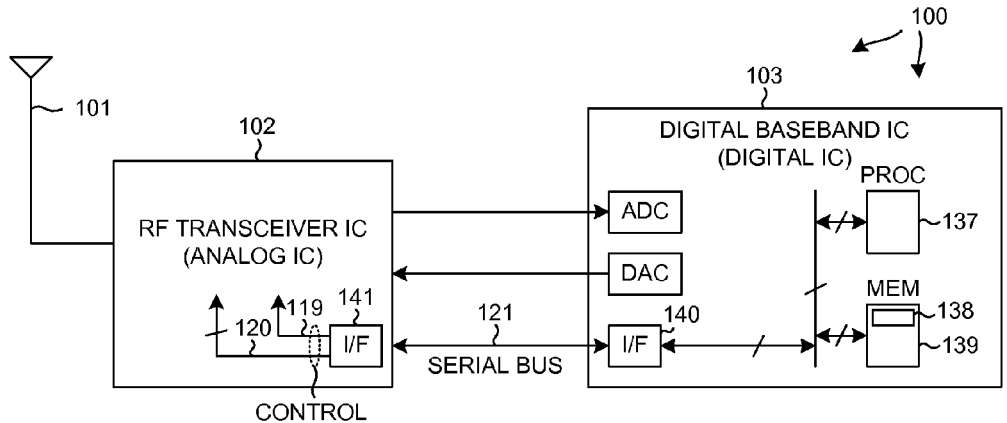
FIG. 3 is a very simplified high level block diagram of a mobile communication device 100 such as a cellular telephone.

FIG. 3 is a very simplified high level block diagram of a mobile communication device 100 such as a cellular telephone. Device 100 includes (among other parts not illustrated) an antenna 101 usable for receiving and transmitting cellular telephone communications, an RF transceiver integrated circuit 102, and a digital baseband integrated circuit 103.

Figure 4:
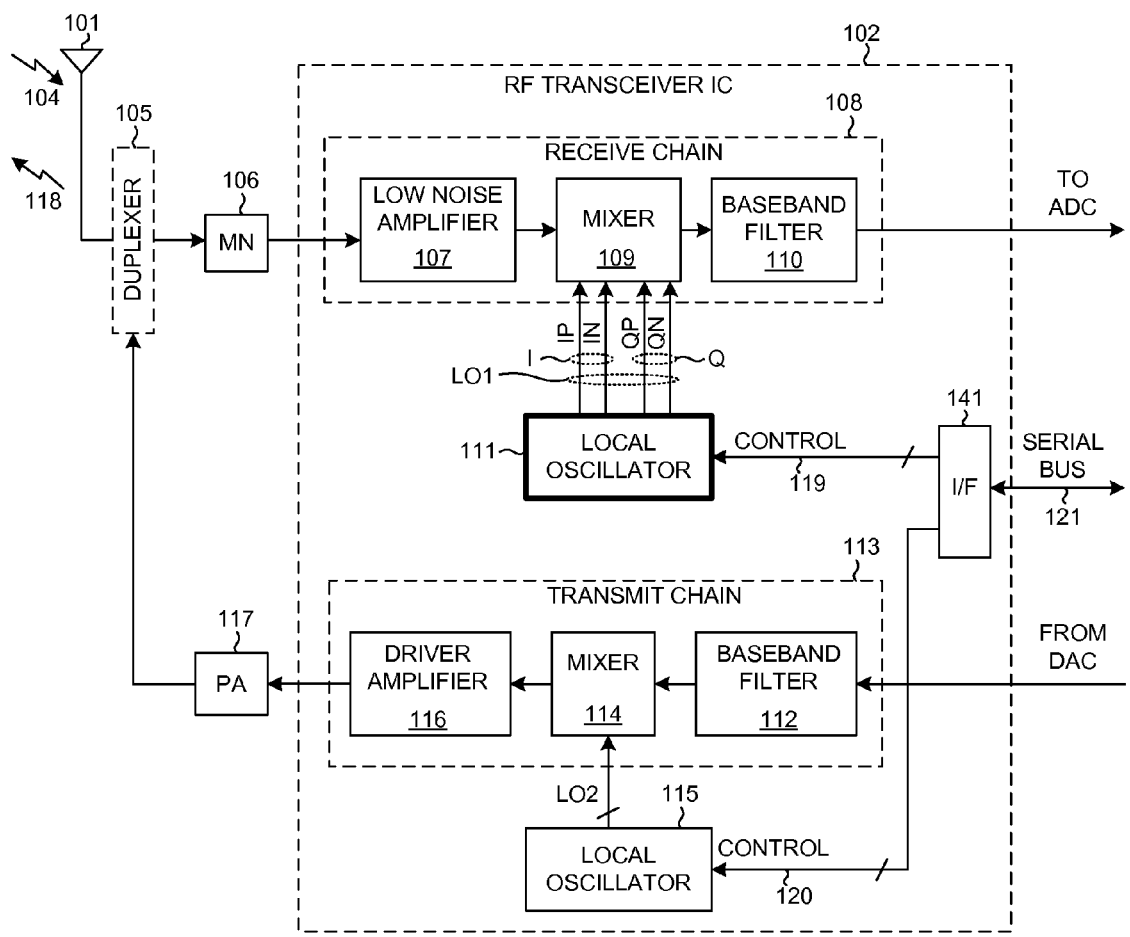
FIG. 4 is a more detailed diagram of the RF transceiver integrated circuit 102 of FIG. 3.

FIG. 4 is a more detailed diagram of the RF transceiver integrated circuit 102 of FIG. 3. In one very simplified explanation of the operation of the cellular telephone, if the cellular telephone is being used to receive audio information as part of a cellular telephone conversation, then an incoming transmission 104 is received on antenna 101. The signal passes through a duplexer 105 and a matching network 106 and is amplified by a Low Noise Amplifier (LNA) 107 of a receive chain 108. After being downconverted in frequency by a mixer 109 and after being filtered by baseband filter 110, the information is communicated to the digital baseband integrated circuit 103 for analog-to-digital conversion and further processing in the digital domain. How the receive chain downconverts is controlled by changing the frequency of a local oscillator signal LO1 generated by local oscillator 111. What is referred to as local oscillator signal LO1 actually includes two differential signals I and Q. As explained below, each of these differential signals I and Q is a differential signal communicated across a set of two conductors.

If, on the other hand, the cellular telephone 100 is being used to transmit audio information as part of a cellular telephone conversation, then the audio information to be transmitted is converted into analog form in digital baseband integrated circuit 103. The analog information is supplied to a baseband filter 112 of a transmit chain 113 of RF transceiver integrated circuit 102. After filtering, the signal is upconverted in frequency by mixer 114. The upconversion process is tuned and controlled by controlling the frequency of a local oscillator signal LO2 generated by local oscillator 115. Local oscillator signal LO2 includes two differential signals I and Q. The resulting upconverted signal is amplified by a driver amplifier 116 and an external power amplifier 117. The amplified signal is supplied to antenna 101 for transmission as outgoing transmission 118. The local oscillators 111 and 115 of the receive and transmit chains are controlled by control information CONTROL received via conductors 119 and 120 from digital baseband integrated circuit 103 by a serial bus 121.

Figure 5:
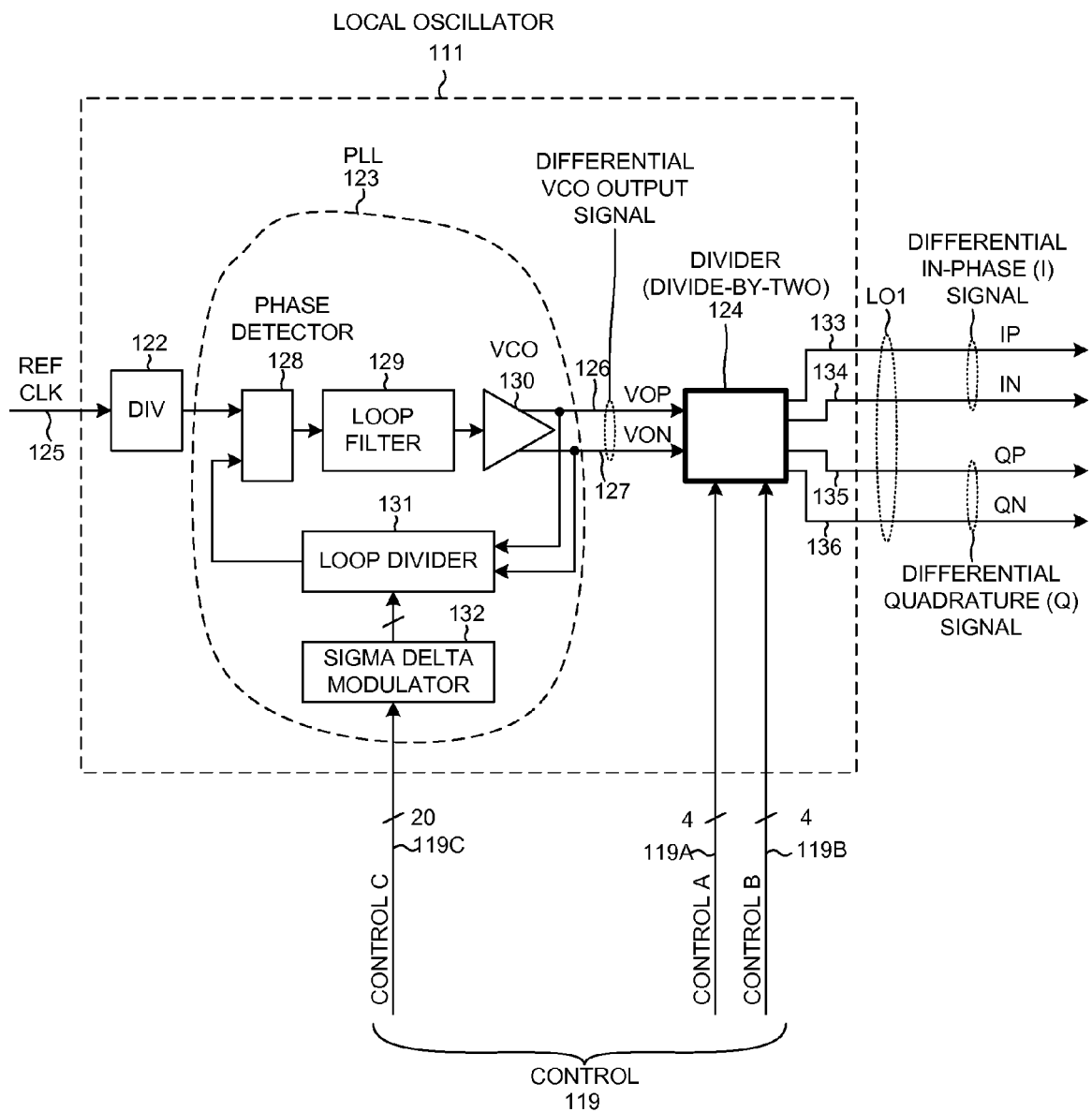
FIG. 5 is a more detailed diagram of the local oscillator 111 of the receiver in the RF transceiver integrated circuit 102 of FIG. 4.

FIG. 5 is a more detailed diagram of local oscillator 111 of the receiver in the RF transceiver integrated circuit 102 of FIG. 4. Local oscillator 111 includes a divider 122, a Phase-Locked Loop (PLL) 123 and a divide-by-two circuit 124. The multi-bit digital control value CONTROL on conductors 119 of FIG. 4 actually includes a multi-bit digital control value CONTROL C on conductors 119C, a multi-bit digital control value CONTROL A on conductors 119A, and a multi-bit digital control value CONTROL B on conductors 119B. As illustrated in FIG. 5, conductors 119 include the conductors 119A, 119B and 119C.

PLL 123 receives an externally generated reference signal REF CLK on conductor 125 (for example, a 19.2 MHz signal generated by an external crystal oscillator) and the multi-bit digital control value CONTROL C, and generates therefrom a differential PLL output signal VO. The label "VO" used here indicates that the VO signal is the VCO output signal. The signal VO includes a signal VOP on conductor 126 and a signal VON on conductor 127. The signal VO is of a desired frequency as determined by the multi-bit control word CONTROL C on conductors 119C. The PLL 123 in this case includes a phase comparator 128, a loop filter 129, a Voltage Controlled Oscillator (VCO) 130, a loop divider 131, and a Sigma-Delta Modulator 132. The VO signal output by VCO 130 is divided down in frequency by divide-by-two circuit 124 to generate local oscillator signal LO1. As explained above, local oscillator signal LO1 includes two differential output signals I and Q and is supplied to the mixer 109 of the receiver. Differential output signal I involves signal IP on conductor 133 and signal IN on conductor 134. Differential output signal Q involves signal QP on conductor 135 and signal QN on conductor 136. Divide-by-two circuit 124 also receives the pair of multi-bit digital control values CONTROL A and CONTROL B. These control values are used by divider 124 as explained in further detail below. The digital control words CONTROL A, CONTROL B, and CONTROL C are determined by a processor 137 (see FIG. 3) in digital baseband integrated circuit 103 by the execution of a set of processor-executable instructions 138 stored in a processor-readable medium 139. The digital control words, once determined, are communicated through serial bus interface 140, serial bus 121, serial bus interface 141, and conductors 119 to local oscillator 111.

Figure 6:
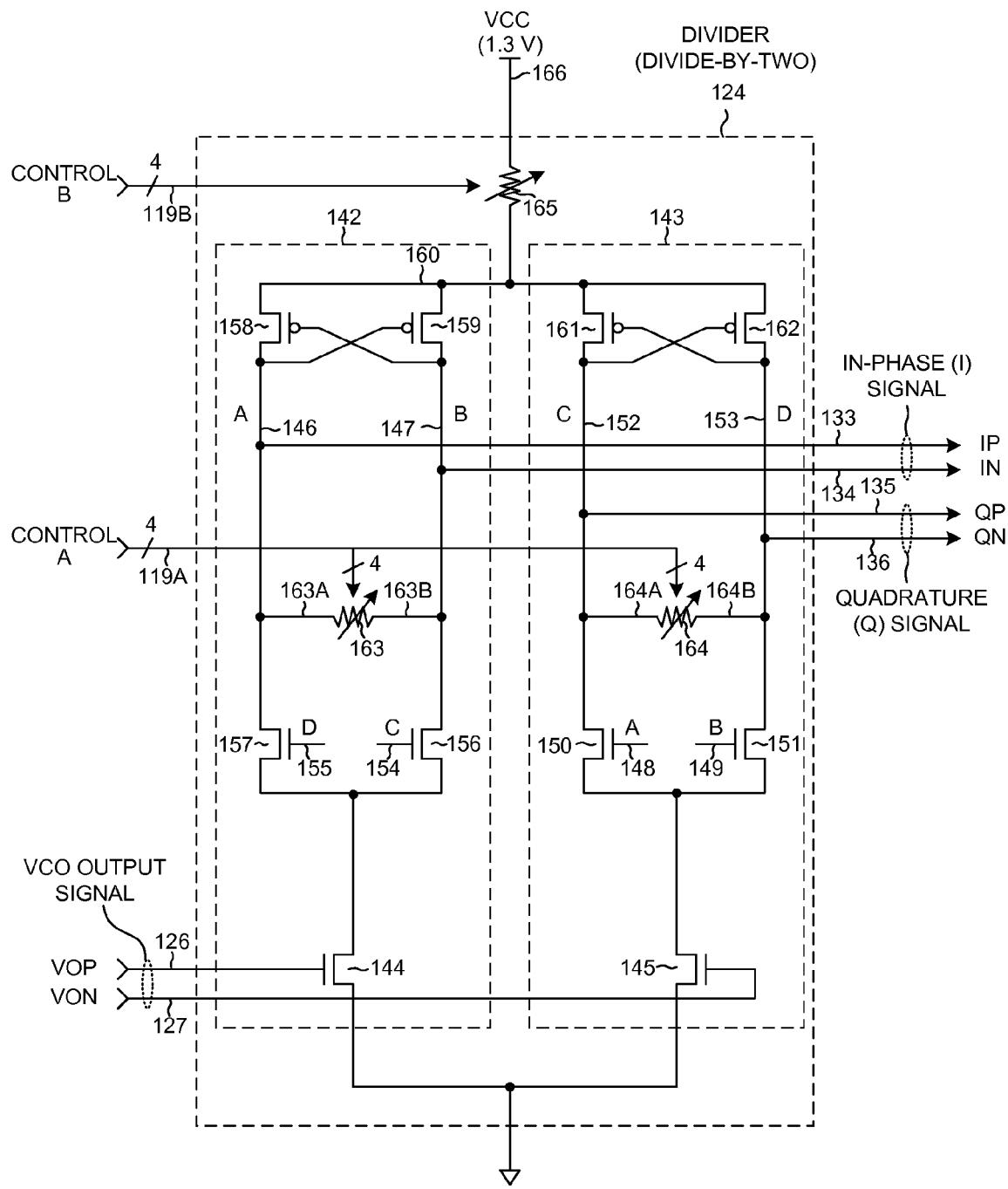
FIG. 6 is a more detailed diagram of the divide-by-two circuit 124 within the local oscillator 111 of FIG. 5.

FIG. 6 is a more detailed diagram of divide-by-two circuit 124 of FIG. 5. Divide-by-two circuit 124 includes a first differential latch 142 and a second differential latch 143. The two latches are clocked on opposite phases of the VO signal due to the coupling of the VOP signal to the gate of N-channel transistor 144 of first differential latch 142, and due to the coupling of the opposite phase signal VON to the gate of N-channel transistor 145 of second differential latch 143. In the present example, each VOP and VON signal has a sinusoidal waveform and oscillates between 0.2 volts and 1.3 volts. A differential output signal on differential output nodes 146 (A) and 147 (B) of the first differential latch is supplied onto differential input leads 148 and 149 of the second differential latch. Input lead 148 is the gate of N-channel data transistor 150 of the second differential latch. Input lead 149 is the gate of N-channel data transistor 151 of the second differential latch. Similarly, a differential output signal on differential output nodes 152 (C) and 153 (D) of the second differential latch is supplied onto differential input leads 154 and 155 of the first differential latch. Input lead 154 is the gate of N-channel data transistor 156 of the first differential latch.

Input lead 155 is the gate of N-channel data transistor 157 of the first differential latch. Due to the supplying of the output signal of the first latch to the input leads of the second latch, and due to the coupling of the output signal of the second latch back onto the input leads of the first latch, and due to the clocking of the two latches on opposite phases of the VO signal, the overall divider circuit frequency divides by two.

A pair of cross-coupled P-channel transistors 158 and 159 supplies current from a supply voltage conductor 160 onto the output nodes 146 and 147 of the first differential latch. Similarly, a pair of cross-coupled P-channel transistors 161 and 162 supplies current from the supply voltage conductor 160 onto the output nodes 152 and 153 of the second differential latch. Each of the differential latches includes a variable resistance element as illustrated. Variable resistance element 163 provides a programmable and digitally-controllable variable resistance between node 146 and node 147. The resistance of variable resistance element 163 between leads 163A and 163B is determined by multi-bit digital control value CONTROL A on conductors 119A. Variable resistance element 163 may, for example, involve a network of resistive circuit elements and associated field effect transistors, where the transistors are turned on and off as a function of the multi-bit digital control value CONTROL A so as to switch resistive circuit elements into and out of the network, thereby changing the resistance across the overall network. The resistive circuit elements may, in one example, be resistors. Variable resistance element 163 has a resistance controllable within the range of from 200 ohms to 1.4 k ohms.

Similarly, variable resistance element 164 provides a programmable and digitally-controllable variable resistance between node 152 and node 153. The resistance of variable resistance element 164 between leads 164A and 164B is determined by multi-bit digital control value CONTROL A on conductors 119A. The output resistance of first differential latch 142 across nodes 146 and 147 and the output resistance of second differential latch 143 across nodes 152 and 153 can be changed by changing the CONTROL A multi-bit digital control value. In addition to variable resistance elements 163 and 164, divider 124 includes a third programmable and digitally-controllable variable resistance element 165. By changing the CONTROL B multi-bit digital value on conductors 119B, the resistance between supply voltage node 166 and supply voltage node 160 can be changed.

The frequency operating range of a divider involving differential latches is roughly determined by what is commonly referred to as the "3 dB bandwidth" of the latches (the natural frequency of the latches). To keep the divider oscillating as the operating frequency increases, the 3 dB bandwidth of the latches should be maintained. The 3 dB bandwidth of the latches is related to the natural oscillating frequency of the overall divider. Consider for example, the circuit of FIG. 2. The output nodes of the latches are loaded, including by capacitive loading of the circuitry that the divider is driving. In one example, this circuitry to be driven is a pair of buffers that in turn supply buffered I and Q signals to a mixer. As frequency increases, the loading of this capacitive load increases. In order to maintain the 3 dB bandwidth of the latches, the output resistances of the latches are reduced. This is done by reducing the resistances of the variable pullup load resistances shown in FIG. 2. Unfortunately, reducing these resistances decreases the voltage gains of the latches. For the same current flow across the resistances, the smaller resistances result in smaller output voltage swings. To counter this effect, the DC bias current flowing through the data transistors can be increased. This increase in DC bias current flow is accomplished by adjusting the bias currents through biasing circuits (not shown in FIG. 2) that bias the gates of the four pulldown N-channel transistors whose gates are driven with the VO signal. Unfortunately, this increased DC bias current flow at higher operating frequency results in increased power consumption of the divider. In general, in the circuit of FIG. 2, as frequency increases both the output voltage swing decreases and power consumption increases.

Figure 2:
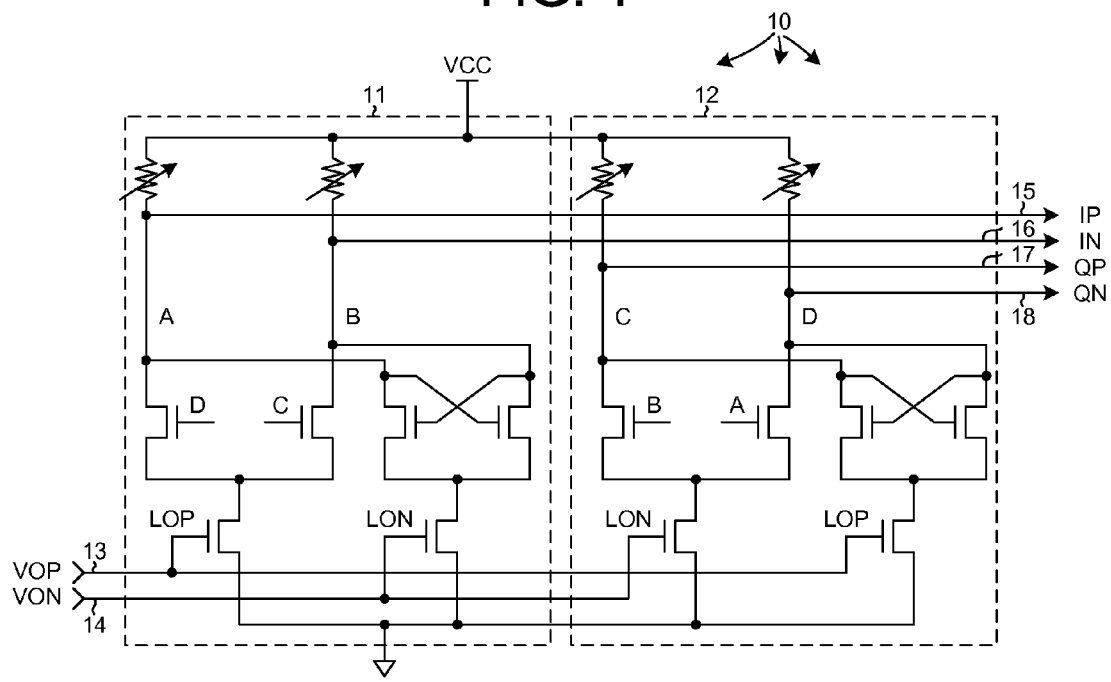
FIG. 2 (Prior Art) is a diagram of a second type of conventional divider.
Figure 7:
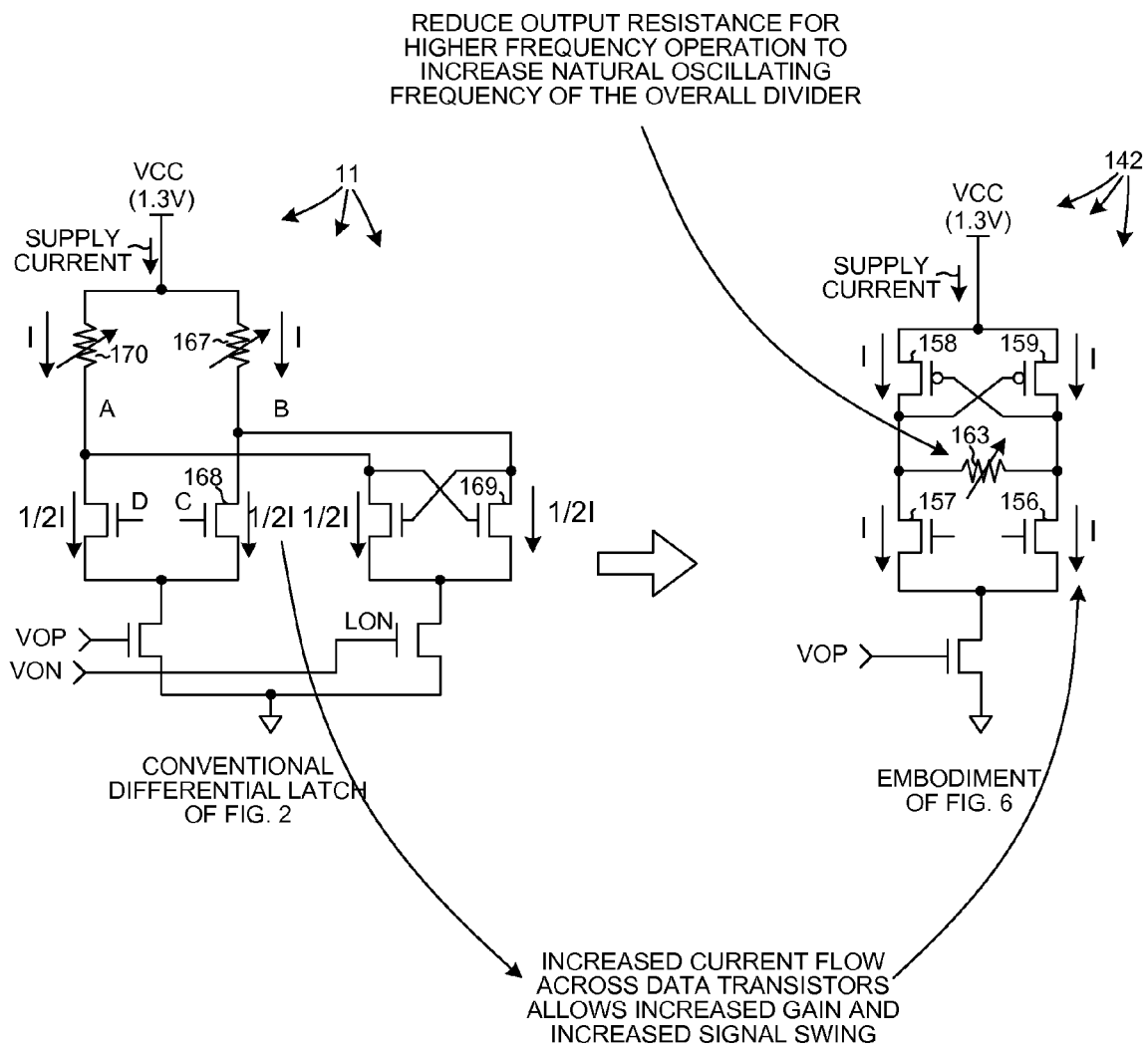
FIG. 7 is a diagram that illustrates differences between the divider 124 of FIG. 6 and the conventional divider of FIG. 2.

FIG. 7 is a diagram that illustrates differences between the divider 124 of FIG. 6 and the conventional divider 10 of FIG. 2. The circuit 11 on the left of FIG. 7 represents the leftmost differential latch 11 of the divider 10 of FIG. 2. The circuit 142 on the right of FIG. 7 represents the leftmost differential latch of the divider 124 of FIG. 6. In the case of the circuit 11 to the left, if a current I is flowing across variable resistance 167, then roughly half of that current (½I) flows across each of data transistors 168 and 169 because the two transistors share the current flow. This reduced ½I current flow across the data transistors translates into lower voltage gain of the latch as compared to a situation in which the current flow is the full current I. The circuit 142 on the right, as compared to the circuit 11 on the left, has increased current flow I across the data transistors 157 and 156 assuming that the transistors in the two circuits have identical device sizes and that the N-channel pulldown transistors that receive the VOP and VON signals are similarly biased. Increased current flow through the data transistors correlates to higher differential latch voltage gain. To a first approximation, the voltage gain Av of the overall divider 124 is proportional to the product of the transconductance Gm of the overall divider and the load resistance RL. The load resistance RL in this case is determined by the combined effect of the resistance of variable resistance element 163, the load of the input of the buffer being driven, and the drain-to-source resistance Rds of the P-channel transistors 158 and 159. The overall transconductance Gm, however, is roughly proportional to the square root of the DC current flow through the data transistors. Accordingly, increasing the DC current flow as compared to the circuit topology of FIG. 2 results in increased differential latch voltage gain.

In another advantageous aspect, DC current flow through the data transistors in the circuit 142 to the right in FIG. 7 does not flow across the variable resistance element 163. In the conventional circuit topology of FIG. 2, on the other hand, the increasing of DC current flow to maintain 3 dB bandwidth at higher operating frequencies results in increased DC current flow across resistances 167 and 170. Such increased DC current flow across the resistances of elements 167 and 170 drops the DC bias point of the signals on the output nodes of the differential latch. This drop serves to reduce the range that the output voltage can swing, and therefore reduces output signal voltage swing. Moreover, in the circuit 11 to the left in FIG. 7, there is a limit to how low the DC bias point can be set in the conventional circuit of FIG. 2. The input transistors are to operate in the saturation region and such operation cannot be maintained if the DC bias voltage on the output nodes drops below approximately one volt. The differential latch circuit on the right of FIG. 7 does not suffer from these problems and limitations because DC bias current does not flow across variable resistance element 163. The output resistance of the differential latch is reduced at high operating frequencies to maintain 3 dB bandwidth without reducing output signal voltage swing to the degree that output signal voltage swing is reduced in the circuit 11 to the left on FIG. 7.

FIG. 8 is a chart that compares operation of the divider of FIG. 6 to the conventional divider of FIG. 2. As indicated in the chart of FIG. 8, the divider of FIG. 6 is operable over a wide frequency range from 4.6 gigahertz to 14 gigahertz, where current consumption ranges from approximately 2.4 milliamperes to 4.2 milliamperes, and where output signal voltage swing ranges from approximately 1.14 volts to 0.73 volts for a 1.3 volt supply voltage. At the high operating frequency of 14 gigahertz, the divider of FIG. 6 maintains a large output signal voltage swing of approximately 0.73 volts as compared to conventional divider of FIG. 2 whose output signal voltage swing degrades down to 0.48 volts for a 1.3 volt supply voltage. The circuit of FIG. 6 maintains its large output signal voltage swing at the high 14 gigahertz operating frequency while consuming only 3.9 milliamperes of supply current, whereas the conventional circuit of FIG. 2 consumes a much larger 15.7 milliamperes when operating at the high 14 gigahertz. Accordingly, over the 4.6 gigahertz to 14 gigahertz operating frequency range, the output signal voltage swing of divider 124 does not decrease to less than fifty percent of the supply voltage. Moreover, over the 4.6 gigahertz to 14 gigahertz operating range, current consumption of the divider 124 does not increase to more than two hundred percent of its minimum value (in this operating frequency range).

Figure 1:
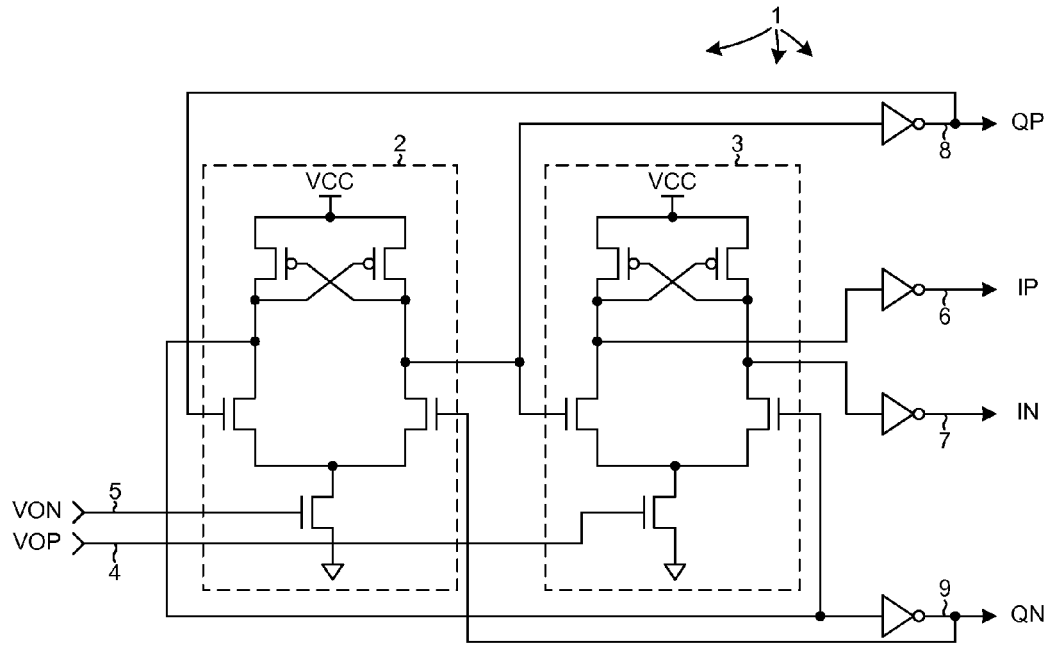
FIG. 1 (Prior Art) is a diagram of a first type of conventional divider.

The conventional divider of FIG. 1 is hardly comparable to the divider of FIG. 6 because the divider of FIG. 1 cannot operate at a frequency in excess of four gigahertz. The conventional divider of FIG. 1 also has a relatively narrow frequency operating range at least in part because no mechanism is provided that reduces output impedance to maintain 3 dB bandwidth at high operating frequencies.

Figure 9:
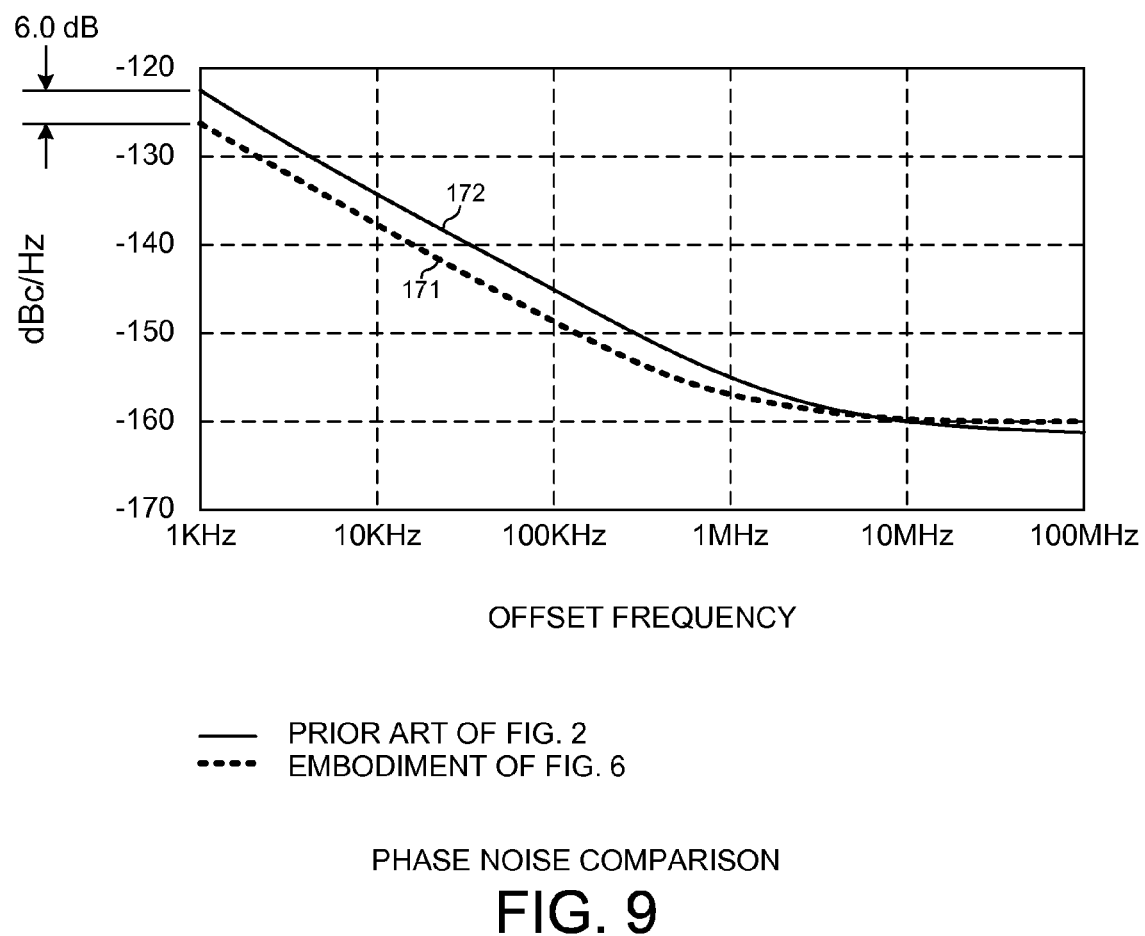
FIG. 9 is a chart that compares the phase noise of the divider of FIG. 6 to the phase noise of the conventional divider of FIG. 2.

FIG. 9 is a chart that compares phase noise 171 of the divider of FIG. 6 to the phase noise 172 of the conventional divider of FIG. 2 as an example. The chart shows results of a simulation of the divider of FIG. 6 when the divider is supplied with a 7.8 gigahertz input signal of 0.8 volt differential amplitude. The horizontal axis labeled "offset frequency" indicates an offset in frequency from the fundamental of the operating frequency. As illustrated by FIG. 9, within a frequency range of 500 kilohertz from the fundamental of the operating frequency, the divider of FIG. 6 exhibits about six dB lower phase noise as compared to the phase noise exhibited by the conventional circuit of FIG. 2.

Figure 10:
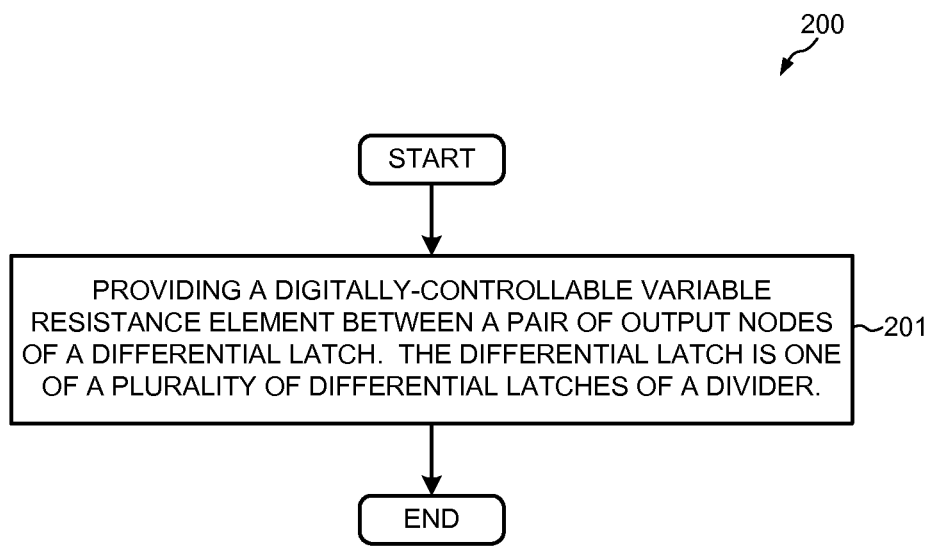
FIG. 10 is a flowchart of a method in accordance with one novel aspect.

FIG. 10 is a flowchart of a method 200 in accordance with one novel aspect. A digitally-controllable variable resistance element is provided (step 201) between a pair of output nodes of a differential latch, where the differential latch is one of a plurality of differential latches of a divider. In this method, a multi-bit digital control value supplied to the digitally-controllable variable resistance element need not be changed during operation of the divider, but rather the multi-bit digital control value may have a value that is set at initialization of the divider and thereafter remains fixed during operation of the divider. The value of the multi-bit digital control value is determined based on the operating frequency of the divider. In this way, multiple instances of the same circuit in multiple instances of the same integrated circuit can be programmed using different multi-bit digital control values to accommodate operation of the different instances of the integrated circuit in different operating conditions. As explained above, the digitally-controllable variable resistance element is controlled such that the 3 dB bandwidth (natural frequency) is maintained for the frequency of operation. The optimal resistance of the digitally-controllable variable resistance element at a given frequency can be determined by circuit simulation, by testing of an actual device, or both. The digitally-controllable variable resistance element may, for example, be provided as set forth in step 201 by manufacturing, or distributing, or selling, an integrated circuit embodying the divider of FIG. 6 or a device incorporating an integrated circuit embodying the divider of FIG. 6.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In one illustrative example, a set of processor-executable instructions 138 is stored in a memory (a processor-readable medium) 139 in digital baseband integrated circuit 103 of FIG. 3. Processor 137 accesses memory 139 across a bus and executes the instructions 138, thereby causing integrated circuit 103 to configure and control divider 124 in local oscillator 111 of the RF transceiver integrated circuit 102. By changing the multi-bit digital control value CONTROL A, processor 137 causes the output resistance of the differential latches in divider 124 to be reduced as a function of increasing operating frequency of divider 124.

Although certain specific embodiments are described above for instructional purposes, the teachings of this patent document have general applicability and are not limited to the specific embodiments described above. Although the divider of FIG. 6 is described above as being present in local oscillator block 111 of FIG. 4 such that I and Q differential signals are output from block 111, it is understood that the divider of FIG. 6 may be present in mixer block 109. If the divider is present in mixer block 109, then the VCO output signal VOP and VON is supplied from local oscillator block 111 to the divider in mixer block 109 and the I and Q differential signals are generated within mixer block 109. The blocks illustrated in FIG. 4 are functional blocks and do not necessarily represent the physical proximities of the actual circuits represented. Accordingly, various modifications, adaptations, and combinations of the various features of the described specific embodiments can be practiced without departing from the scope of the claims that are set forth below.

What is claimed is:

1. A divider comprising:
a first differential latch disposed in a first integrated circuit, wherein the first differential latch comprises:
   a first output node;
   a second output node;
   a first N-channel transistor having a source, a drain, and a gate, wherein the drain of the first N-channel transistor is coupled to the first output node;
   a second N-channel transistor having a source, a drain, and a gate, wherein the source of the second N-channel transistor is coupled to the source of the first N-channel transistor, wherein the drain of the second N-channel transistor is coupled to the second output node;
   a first P-channel transistor having a source, a drain, and a gate, wherein the drain of the first P-channel transistor is coupled to the first output node, wherein the gate of the first P-channel transistor is coupled to the second output node; and
   a second P-channel transistor cross-coupled with the first P-channel transistor, the second P-channel transistor having a drain coupled to the second output node, a source coupled to the source of the first P-channel transistor, and a gate coupled to the first output node; and
   a first variable resistance element coupled between the first output node and the second output node, wherein the first variable resistance element has a first lead and a second lead and does not have any inductors, wherein the first lead is directly connected to the first output node and to the drain of the first N-channel transistor, wherein the second lead is directly connected to the second output node and to the drain of the second N-channel transistor, wherein the first variable resistance element receives a first multi-bit digital control signal supplied from a processor disposed in a second integrated circuit, wherein the first multi-bit digital control signal controls the first variable resistance element to at least in part determine an output resistance of the first differential latch, and wherein the output resistance of the first differential latch is changed based at least in part on digital control information sent across a serial bus from the second integrated circuit to the first integrated circuit.

2. The divider of claim 1, further comprising:
a second differential latch comprising:
   a third output node;
   a fourth output node;
   a third N-channel transistor having a source, a drain, and a gate, wherein the drain of the third N-channel transistor is coupled to the third output node;
   a fourth N-channel transistor having a source, a drain, and a gate, wherein the source of the fourth N-channel transistor is coupled to the source of the third N-channel transistor, wherein the drain of the fourth N-channel transistor is coupled to the fourth output node;
   a third P-channel transistor having a source, a drain, and a gate, wherein the drain of the third P-channel transistor is coupled to the third output node, wherein the gate of the third P-channel transistor is coupled to the fourth output node;
   a fourth P-channel transistor having a source, a drain, and a gate, wherein the drain of the fourth P-channel transistor is coupled to the fourth output node, and wherein the source of the fourth P-channel transistor is coupled to the source of the third P-channel transistor, and wherein the gate of the fourth P-channel transistor is coupled to the third output node; and
   a second variable resistance element coupled between the third output node and the fourth output node.

3. The divider of claim 2, wherein the gate of the first N-channel transistor is coupled to the fourth output node, wherein the gate of the second N-channel transistor is coupled to the third output node, wherein the gate of the third N-channel transistor is coupled to the first output node, and wherein the gate of the fourth N-channel transistor is coupled to the second output node.

4. The divider of claim 3, wherein the first differential latch further includes a fifth N-channel transistor, wherein a drain of the fifth N-channel transistor is coupled to the sources of the first and second N-channel transistors of the first differential latch, wherein the second differential latch further includes a sixth N-channel transistor, wherein a drain of the sixth N-channel transistor is coupled to the sources of the third and fourth N-channel transistors of the second differential latch, wherein the sources of the fifth and sixth N-channel transistors are coupled to a ground node, wherein a differential input signal is present between the gates of the fifth and sixth N-channel transistors, wherein an in-phase (I) differential output signal is present between the first and second output nodes of the first differential latch, and wherein a quadrature (Q) differential output signal is present between the third and fourth output nodes of the second differential latch.

5. The divider of claim 2, further comprising:
   a third variable resistance element coupled between a first supply voltage node and a second supply voltage node coupled to the sources of the first, second, third, and fourth P-channel transistors, wherein the first and second P-channel transistors are coupled between the first variable resistance element and the third variable resistance element, and wherein the third and fourth P-channel transistors are coupled between the second variable resistance element and the third variable resistance element.

6. The divider of claim 5, wherein the third variable resistance element does not have any inductors and receives a second multi-bit digital control signal that determines a resistance between the first supply voltage node and the second supply voltage node.

7. The divider of claim 1, wherein the first differential latch further comprises:
   a third N-channel transistor having a source, a drain and gate, wherein the drain of the third N-channel transistor is coupled to the source of the first N-channel transistor and to the source of the second N-channel transistor.

8. The divider of claim 7, wherein an input signal of a first frequency is present on the gate of the third N-channel transistor of the first differential latch, and wherein an output signal of a second frequency is present between the first and second output nodes of the first differential latch, wherein the first frequency is twice the second frequency.

9. The divider of claim 1, further comprising:
   a second variable resistance element coupled between a supply voltage node and the sources of the first and second P-channel transistors of the first differential latch.

10. The divider of claim 9, wherein the second variable resistance element further receives the first multi-bit digital control signal, and wherein the first multi-bit digital control signal further determines a resistance of the second variable resistance element.

11. The divider of claim 1, wherein the output resistance of the first differential latch is digitally-controlled and adjustable by adjusting a resistance of the first variable resistance element.

12. The divider of claim 11, wherein the first multi-bit digital control signal comprises a multi-bit digital control word that sets the resistance of the first variable resistance element.

13. The divider of claim 1, wherein the first variable resistance element includes one or more resistive circuit elements and one or more field effect transistors.

14. The divider of claim 13, wherein the first multi-bit digital control signal turns the one or more field effect transistors on and off to switch the one or more resistive circuit elements and thereby control a resistance of the first variable resistance element.

15. The divider of claim 1, wherein the drain of the first P-channel transistor is directly connected to the first lead of the first variable resistance element and the drain of the second P-channel transistor is directly connected to the second lead of the first variable resistance element.

16. The divider of claim 1, further comprising:
a second variable resistance element coupled between a first supply voltage node and a second supply voltage node coupled to the sources of the first and second P-channel transistors, wherein the first and second P-channel transistors are coupled between the first variable resistance element and the second variable resistance element.

17. The divider of claim 16, wherein the second variable resistance element does not have any inductors and receives a second multi-bit digital control signal that determines a resistance between the first supply voltage node and the second supply voltage node.

18. A circuit comprising:
a first differential latch disposed in a first integrated circuit, wherein the first differential latch comprises a cross-coupled pair of P-channel transistors and a variable resistance element that does not have any inductors, wherein the variable resistance element has a first lead that is directly connected to a first output node of the first differential latch and to a drain of one of the pair of P-channel transistors, wherein the variable resistance element has a second lead that is directly connected to a second output node of the first differential latch and to a drain of the other of the pair of P-channel transistors, wherein the first differential latch has a digitally-controllable output resistance, wherein the variable resistance element receives a multi-bit digital control value supplied from a processor disposed in a second integrated circuit, wherein the multi-bit digital control value controls the first variable resistance element to at least in part determine a digitally-controllable output resistance of the first differential latch, and wherein the digitally-controllable output resistance of the first differential latch is changed based at least in part on digital control information sent across a serial bus from the second integrated circuit to the first integrated circuit; and
a second differential latch disposed in the first integrated circuit, wherein the second differential latch comprises a cross-coupled pair of P-channel transistors, wherein the second differential latch has a digitally-controllable output resistance, and wherein the first differential latch is clocked approximately one hundred eighty degrees out of phase with respect to a clocking of the second differential latch.

19. The circuit of claim 18, wherein the first differential latch has a plurality of control conductors, and wherein the multi-bit digital control value is supplied on the plurality of control conductors to at least in part determine the digitally-controllable output resistance of the first differential latch.

20. The circuit of claim 18, wherein the first differential latch supplies a first differential output signal to a pair of input leads of the second differential latch, and wherein the second differential latch supplies a second differential output signal to a pair of input leads of the first differential latch.

21. The circuit of claim 18, further comprising:
a second variable resistance element coupled between a first supply voltage node and a second supply voltage node coupled to sources of the cross-coupled pairs of P-channel transistors of the first and second differential latches, wherein the cross-coupled pair of P-channel transistors of the first differential latch are coupled between the variable resistance element of the first differential latch and the second variable resistance element, and wherein the cross-coupled pair of P-channel transistors of the second differential latch are coupled between the second variable resistance element and a third variable resistance element.

22. The circuit of claim 21, wherein the second variable resistance element does not have any inductors and receives a second multi-bit digital control value that determines a resistance between the first supply voltage node and the second supply voltage node.

23. A method comprising:
providing a digitally-controllable variable resistance element between a pair of output nodes of a first differential latch disposed in a first integrated circuit, wherein the digitally-controllable variable resistance element does not have any inductors, wherein the digitally-controllable variable resistance element has a first lead directly connected to one of the pair of output nodes and a second lead directly connected to the other one of the pair of output nodes;
providing a pair of cross-coupled P-channel transistors as part of the first differential latch, wherein a drain of a first of the P-channel transistors of the pair is directly connected to the first lead of the digitally-controllable variable resistance element, and wherein a drain of a second of the P-channel transistors of the pair is directly connected to the second lead of the digitally-controllable variable resistance element;
supplying a multi-bit digital control value to the digitally-controllable variable resistance element from a processor disposed in a second integrated circuit, wherein the multi-bit digital control value controls the digitally-controllable variable resistance element to at least in part determine an output resistance of the first differential latch; and
sending digital control information across a serial bus from the second integrated circuit to the first integrated circuit to change the output resistance of the first differential latch.

24. The method of claim 23, wherein the digitally-controllable variable resistance element is a network of resistors and associated field effect transistors, and wherein the transistors can be turned on and off so as to switch resistors into and out of the network thereby changing the resistance of the overall network.

25. The method of claim 24, wherein the first differential latch is a part of a divider circuit.

26. The method of claim 25, further comprising:
providing a second differential latch of substantially identical construction to the first differential latch, wherein the pair of output nodes of the first differential latch is coupled to a pair of input nodes of the second differential latch, and wherein a pair of output nodes of the second differential latch is coupled to a pair of input nodes of the first differential latch.

27. The method of claim 23, further comprising:
supplying a differential input signal to the first differential latch; and
receiving a differential output signal from the first differential latch.

28. The method of claim 23, further comprising:
providing a second variable resistance element between a first supply voltage node and a second supply voltage node, wherein the pair of cross-coupled P-channel transistors are coupled between the digitally-controllable variable resistance element provided between the pair of output nodes of the first differential latch and the second variable resistance element and have sources coupled to the second supply voltage node.

29. The method of claim 28, wherein the second variable resistance element does not have any inductors and receives a second multi-bit digital control value that determines a resistance between the first supply voltage node and the second supply voltage node.

30. A divider circuit comprising:
means for frequency dividing a differential input signal and thereby generating an in-phase (I) differential output signal and a quadrature (Q) differential output signal, wherein the means receives a DC supply voltage, wherein the means is operable over a differential input signal frequency range of from 5 GHz to 14 GHz, wherein the means is for generating the I and Q output signals such that an output swing of the I and Q output signals does not decrease to less than fifty percent of the DC supply voltage for operation of the means throughout said differential input signal frequency range, and such that a DC current consumption of the means increases to no more than two hundred percent of its minimum DC current consumption within said differential input signal frequency range; and
a plurality of conductors that receive a multi-bit digital control value supplied from a processor disposed in a second integrated circuit onto the divider circuit, wherein the multi-bit digital control value controls a variable resistance element disposed in the means that does not have any inductors to at least in part determine an output resistance of the means, wherein the variable resistance element has a first lead directly connected to a first output node of the means and a second lead directly connected to a second output node of the means, and wherein the output resistance of the means is changed based at least in part on digital control information sent across a serial bus from the second integrated circuit to the divider circuit.

31. The divider circuit of claim 30, wherein the means includes a differential latch, and wherein the output resistance of the means is at least in part determined by a resistance of the variable resistance element that is controlled by the multi-bit digital control value.

32. The divider circuit of claim 30, wherein the means includes a differential latch having a first P-channel transistor and a second P-channel transistor, wherein a drain of the first P-channel transistor is directly connected to the first lead of the variable resistance element and a drain of the second P-channel transistor is directly connected to the second lead of the variable resistance element.

33. The divider circuit of claim 30, further comprising:
means for changing a resistance between a first supply voltage node and a second supply voltage node coupled to sources of the first and second P-channel transistors, the means for changing coupled between the first supply voltage node and the second supply voltage node, wherein the first and second P-channel transistors are coupled between the variable resistance element and the means for changing.

34. A processor-readable medium encoded with instructions executable on a processor, wherein the processor is disposed in a first integrated circuit and the processor-readable medium is a memory within the first integrated circuit that is accessible by the processor, and wherein executing the instructions on the processor causes the processor to:
supply a multi-bit digital control value to a variable resistance element in a differential latch of a divider disposed in a second integrated circuit, wherein the differential latch includes a pair of cross-coupled P-channel transistors, wherein the multi-bit digital control value controls the variable resistance element to at least in part determine an output resistance of the differential latch, and wherein the variable resistance element has a first lead directly connected to a first output node of the differential latch, has a second lead directly connected to a second output node of the differential latch, and does not have any inductors; and
change the output resistance at least in part by sending digital control information across a serial bus from the first integrated circuit to the second integrated circuit.

35. The processor-readable medium of claim 34, wherein a drain of a first one of the pair of cross-coupled P-channel transistors is directly connected to the first lead of the variable resistance element and a drain of a second one of the pair of cross-coupled P-channel transistors is directly connected to the second lead of the variable resistance element.

36. The processor-readable medium of claim 34, wherein the divider has a second variable resistance element coupled between a first supply voltage node and a second supply voltage node, wherein the pair of cross-coupled P-channel transistors are coupled between the second variable resistance element and the variable resistance element controlled with the multi-bit digital control value and have sources coupled to the second supply voltage node.

37. The processor-readable medium of claim 36, wherein execution of the processor-executable instructions by the processor is further for:
supplying, to the second variable resistance element, a second multi-bit digital control value that determines a resistance between the first supply voltage node and the second supply voltage node, wherein the second variable resistance element does not have any inductors.

38. A divider comprising:
a first differential latch comprising:
a first output node;
a second output node;
a first N-channel transistor having a source, a drain, and a gate, wherein the drain of the first N-channel transistor is coupled to the first output node;
a second N-channel transistor having a source, a drain, and a gate, wherein the source of the second N-channel transistor is coupled to the source of the first N-channel transistor, wherein the drain of the second N-channel transistor is coupled to the second output node;

a first P-channel transistor having a source, a drain, and a gate, wherein the drain of the first P-channel transistor is coupled to the first output node, wherein the gate of the first P-channel transistor is coupled to the second output node; and a second P-channel transistor having a source, a drain, and a gate, wherein the drain of the second P-channel transistor is coupled to the second output node, and wherein the source of the second P-channel transistor is coupled to the source of the first P-channel transistor, and wherein the gate of the second P-channel transistor is coupled to the first output node;

a third N-channel transistor having a source, a drain, and a gate, wherein the drain of the third N-channel transistor is coupled to the source of the first N-channel transistor, and wherein the source of the third N-channel transistor is coupled to a ground conductor; and a first digitally-controllable variable resistance element coupled between the first output node and the second output node, wherein the first digitally-controllable variable resistance element involves a first network of first resistors and associated first transistors that are turned on and off as a function of a multi-bit digital control value so as to switch the first resistors into and out of the first network thereby changing a first resistance across the first network;

a second differential latch comprising:
a third output node;
a fourth output node;
a fourth N-channel transistor having a source, a drain, and a gate, wherein the drain of the fourth N-channel transistor is coupled to the third output node;
a fifth N-channel transistor having a source, a drain, and a gate, wherein the source of the fifth N-channel transistor is coupled to the source of the fourth N-channel transistor, wherein the drain of the fifth N-channel transistor is coupled to the fourth output node;
a third P-channel transistor having a source, a drain, and a gate, wherein the drain of the third P-channel transistor is coupled to the third output node, wherein the gate of the third P-channel transistor is coupled to the fourth output node;
a fourth P-channel transistor having a source, a drain, and a gate, wherein the drain of the fourth P-channel transistor is coupled to the fourth output node, and wherein the source of the fourth P-channel transistor is coupled to the source of the third P-channel transistor, and wherein the gate of the fourth P-channel transistor is coupled to the third output node;
a sixth N-channel transistor having a source, a drain, and a gate, wherein the drain of the sixth N-channel transistor is coupled to the source of the fourth N-channel transistor, and wherein the source of the sixth N-channel transistor is coupled to the ground conductor; and
a second digitally-controllable variable resistance element coupled between the third output node and the fourth output node, wherein the second digitally-controllable variable resistance element involves a second network of second resistors and associated second transistors that are turned on and off as a function of the multi-bit digital control value so as to switch the second resistors into and out of the second network thereby changing a second resistance across the second network, wherein the gate of the first N-channel transistor is coupled to the fourth output node, wherein the gate of the second N-channel transistor is coupled to the third output node, wherein the gate of the fourth N-channel transistor is coupled to the first output node, and wherein the gate of the fifth N-channel transistor is coupled to the second output node;

a first input signal conductor that is coupled to the gate of the third N-channel transistor; and a second input signal conductor that is coupled to the gate of the sixth N-channel transistor, wherein a differential input signal is received onto the divider via the first and second input signal conductors, wherein the divider is operable over a differential input signal frequency range of from 5 GHz to 14 GHz, wherein the divider receives a DC supply voltage and outputs I and Q output signals from the first, second, third and fourth output nodes, and wherein an output swing of the I and Q output signals does not decrease to less than fifty percent of the DC supply voltage for operation of the divider throughout the input signal frequency range.

39. A method, comprising:
supplying, by a processor in a first integrated circuit, a multi-bit digital control value to a variable resistance element in a differential latch of a divider disposed in a second integrated circuit, wherein the differential latch includes a pair of cross-coupled P-channel transistors, wherein the multi-bit digital control value controls the variable resistance element to at least in part determine an output resistance of the differential latch, and wherein the variable resistance element has a first lead directly connected to a first output node of the differential latch, has a second lead directly connected to a second output node of the differential latch, and does not have any inductors; and
sending, by the processor, digital control information across a serial bus from the first integrated circuit to the second integrated circuit, wherein the processor sends the digital control information across the serial bus from the first integrated circuit to the second integrated circuit to change the output resistance of the differential latch.

40. An apparatus, comprising:
a first integrated circuit having a divider disposed therein, wherein the divider includes a differential latch having a pair of cross-coupled P-channel transistors and a variable resistance element that does not have any inductors, and wherein the variable resistance element has a first lead directly connected to a first output node of the differential latch and a second lead directly connected to a second output node of the differential latch; and
a second integrated circuit having a processor configured to:
supply a multi-bit digital control value to the variable resistance element in the differential latch of the divider, wherein the multi-bit digital control value controls the variable resistance element to at least in part determine an output resistance of the differential latch; and
change the output resistance at least in part by sending digital control information across a serial bus from the second integrated circuit to the first integrated circuit.

41. An apparatus, comprising:
means for supplying a multi-bit digital control value from a first integrated circuit to a variable resistance element in a differential latch of a divider disposed in a second integrated circuit, wherein the differential latch includes a pair of cross-coupled P-channel transistors, wherein the multi-bit digital control value controls the variable resistance element to at least in part determine an output resistance of the differential latch, and wherein the variable resistance element has a first lead directly connected to a first output node of the differential latch, has a second lead directly connected to a second output node of the differential latch, and does not have any inductors; and means for sending digital control information across a serial bus from the first integrated circuit to the second integrated circuit to change the output resistance of the differential latch.

\* \* \* \* \*